(12) United States Patent
Berg

(10) Patent No.: US 7,210,961 B2
(45) Date of Patent: May 1, 2007

(54) FASTENING BASE FOR MOUNTING AN ELECTRICAL DEVICE

(75) Inventor: Eckhard Berg, Gruenstadt (DE)

(73) Assignee: Pepperl + Fuchs GmbH (DE)

( * ) Notice: Subject to any disclaimer, the term of this patent is extended or adjusted under 35 U.S.C. 154(b) by 0 days.

(21) Appl. No.: 10/515,702

(22) PCT Filed: Jul. 31, 2003

(86) PCT No.: PCT/EP03/08494

§ 371 (c)(1),
(2), (4) Date: Apr. 15, 2005

(87) PCT Pub. No.: WO2004/065836

PCT Pub. Date: Aug. 5, 2004

(65) Prior Publication Data

US 2005/0173626 A1    Aug. 11, 2005

(30) Foreign Application Priority Data

Jan. 24, 2003    (DE)    ............... 203 01 144 U

(51) Int. Cl.
*H01R 13/60* (2006.01)
(52) U.S. Cl. ..................... 439/574; 439/403
(58) Field of Classification Search ........... 439/574, 439/403, 372
See application file for complete search history.

(56) References Cited

U.S. PATENT DOCUMENTS 4,070,081 A * 1/1978 Takahashi ................ 439/372
4,704,524 A   11/1987 Masaki et al.
4,871,325 A * 10/1989 Maejima et al. ........... 439/353
4,919,627 A *  4/1990 Cable ...................... 439/263
5,829,994 A * 11/1998 Oda et al. ................. 439/157
6,099,330 A *  8/2000 Gundermann et al. ...... 439/157

FOREIGN PATENT DOCUMENTS

| DE | 4115253 C2 | 11/1991 |
| DE | 19618664 C2 | 10/1997 |
| DE | 19900876 C1 | 7/2000 |
| DE | 19920771 A1 | 11/2000 |

* cited by examiner

Primary Examiner—Tho D. Ta
(74) Attorney, Agent, or Firm—John W. LaBatt; Hoffman, Warnick & D'Alessandro LLC

(57) ABSTRACT

The invention relates to a fastening base for mounting an electrical device, particularly an electric sensor or proximity switch, having a reception opening for receiving a connecting piece of the electrical device and with a locking pivoted lever for fixing the connecting piece in the reception opening, the locking pivoted lever being pivotable into a locking position and an open position. The fastening base is characterized in that the locking pivoted lever has a projecting wedge and that the wedge is constructed for an at least partial positive engagement with a recess in the connecting piece when the locking pivoted lever is pivoted into the locking position.

64 Claims, 3 Drawing Sheets

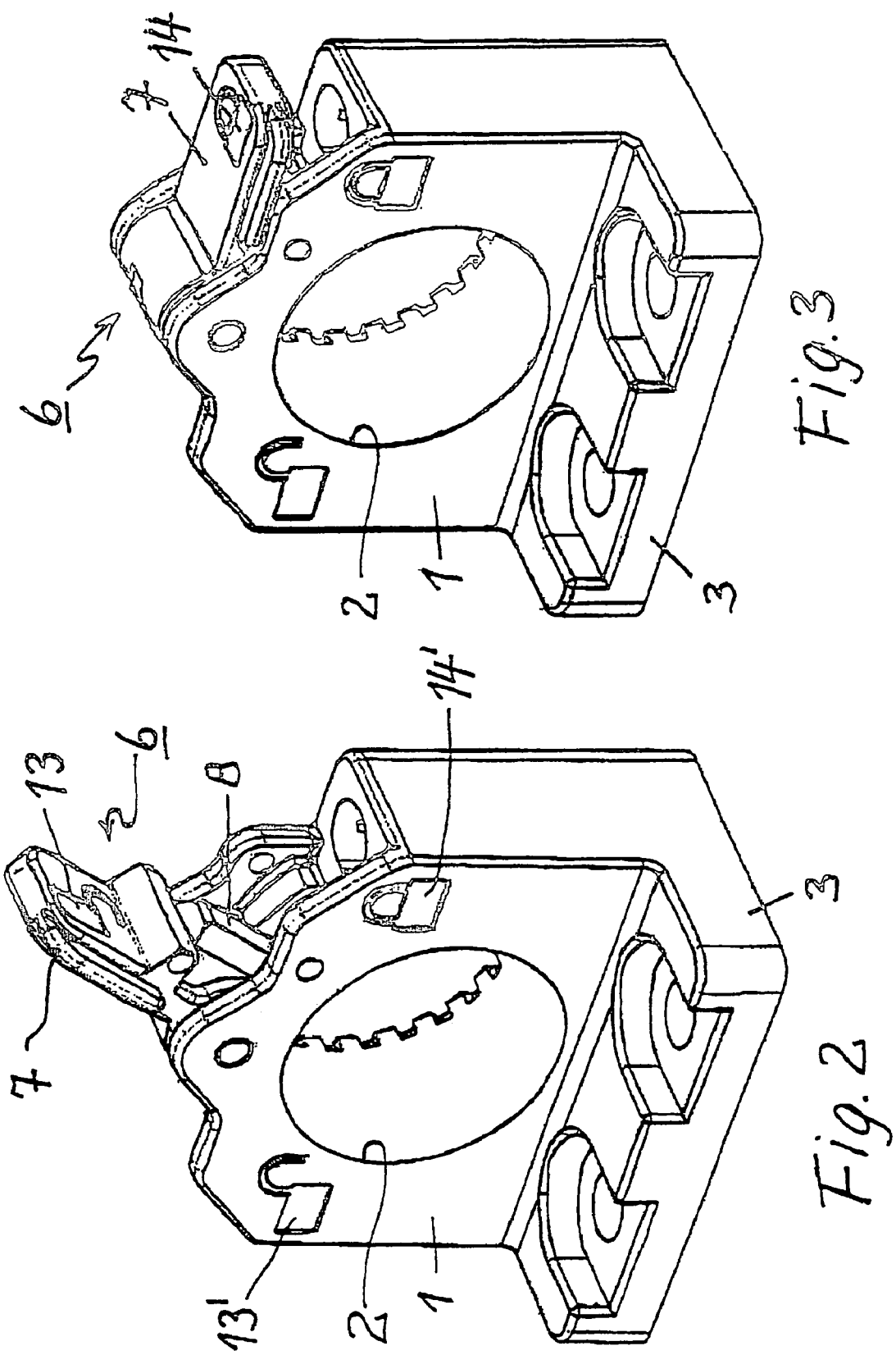

FASTENING BASE FOR MOUNTING AN ELECTRICAL DEVICE

Figure 1:
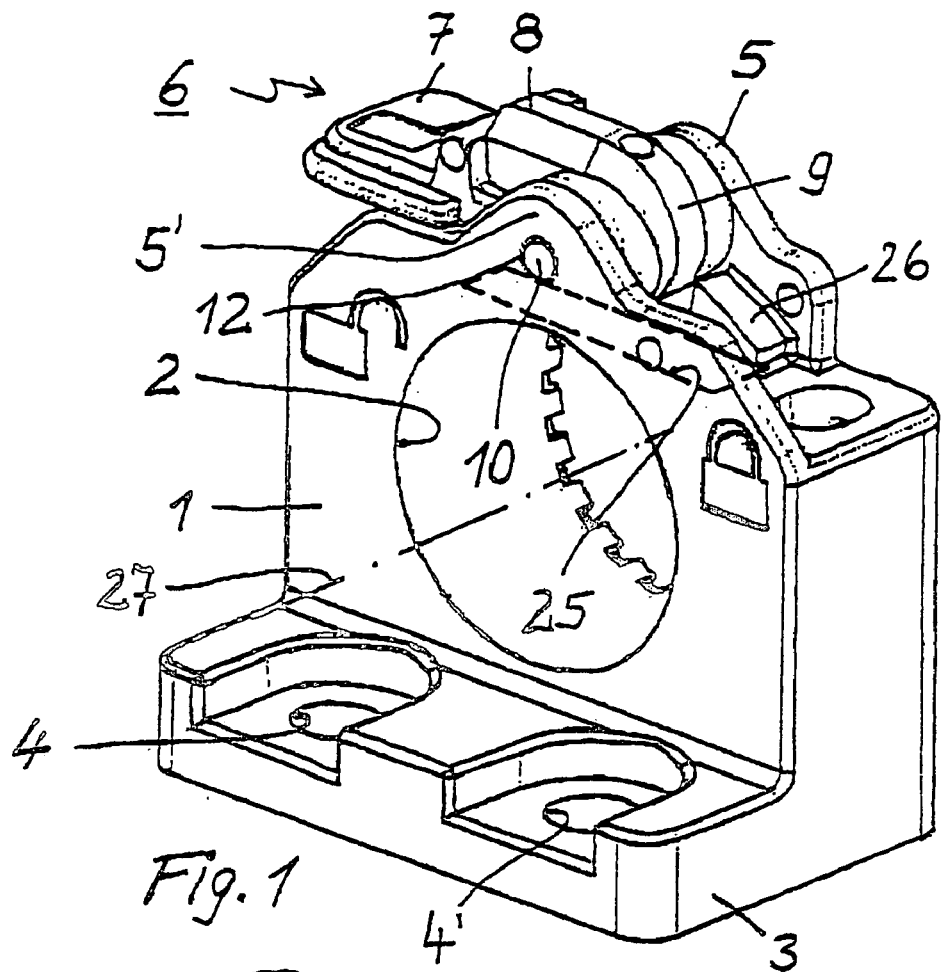

This application claims priority to PCT Application No. PCT/EP03/08494 filed Jul. 31, 2003, which claims the benefit of German Application No. 203 01 144.9 filed Jan. 24, 2003.

The invention relates to a fastening base for mounting an electrical device, particularly an electric sensor or an electric proximity switch, having a reception opening for receiving a connecting piece of the electrical device and with a locking pivoted lever for fixing the connecting piece in the reception opening, the locking pivoted lever being pivotable into a locking position and an open position.

The invention also relates to a fastening base for mounting an electrical device, such as an electric sensor or electric proximity switch, having a reception opening of said fastening base for receiving a connecting piece fitting into the reception opening and projecting from the electrical device and which is provided with a peripherally at least partly circumferential recess, the fastening base having a clamping part which, for mounting the device within the reception opening, can be lowered into the recess of the connecting piece in a locking position and for the release thereof can be raised from the recess of the connecting piece into an open position.

A fastening base according to the preamble is known from DE 199 00 876 C1. In order to bring about a very simple, rapid replacement and final fixing of a proximity switch without it being possible to lose the individual parts or requiring tools for fixing the proximity switch, a pivotable clamping lever is provided in that case. For fixing the proximity switch the clamping lever carries a clamping element with a bulge-like outward curve, which frictionally engages with the proximity switch.

Electrical low voltage switching devices for d.c. voltage are known, which are cuboidal and have a square cross-section and three or four connections or terminals, particularly C-type, inductive proximity switches for d.c. voltage with three or four connections according to EN 60947-5-2, which have standardized dimensions, including for the fastening holes for fastening means. In a known inductive proximity switch of this type, it is necessary to unscrew at least two fastening screws for adjusting the same with respect to the fastening base.

DE 41 15 253 C2 discloses an electronic proximity switch capable of being oriented in different operating directions, which comprises a cubic sensor casing, as well as a reversing angle piece having a connecting piece and being fixable, as desired, in two different reversing positions to a sensor casing edge, as well as a base part to be fitted at the installation location and which is provided with an opening for the rotary reception of the connecting piece of the reversing angle piece and on which the latter can be locked in four rotary positions, in each case differing by 90°. The sensor casing contains all the switching electronics and the base part is constructed purely as an assembly block and an axially fixed plug is mounted in rotary manner within the connecting piece provided with four radial through holes. The assembly block carries a clamping screw which, as desired, can be screwed through one of the through holes until it impacts the plug, so that by means of the clamping screw the rotary position of the reversing angle piece is stepwise rotation-locked and the rotation position of the plug is continuously rotation-locked on the assembly block.

DE 196 18 664 A1 discloses a fastening device for receiving a casing, such as a proximity switch, said device comprising a fastening base with a reception opening within which the casing is fixed in a rotatable and lockable manner. The casing has a swivel base provided with a pipe flange, which is seated within the reception opening of the fastening base and on which an inclined plane is provided. In the marginal area of one of its end faces the fastening base also has a reception space intersecting the reception opening and into which projects the inclined plane of the pipe flange and a clamping wedge is positioned in movable manner within the reception space. At one end, the clamping wedge has a through hole for the passage of one of the fastening screws for the fastening base and on screwing down the fastening base by means of the fastening screw mounting the clamping wedge, the latter slides on the inclined plane of the swivel base for the clamping fixing thereof within the fastening base. Thus, as a result of the clamping by means of fastening screw and clamping wedge, both the pipe flange and the plug receptacle are clamped within the pipe flange and the casing is mounted simultaneously in clamping manner. As a result of the inclined planes of the pipe flange and the clamping wedge, during clamping there is also a slight lateral movement of the casing which contributes to a reliable clamping action. However, it is disadvantageous that for the replacement of the casing or sensor screws have to be unscrewed, and as a result, the construction and design of the fastening base becomes more complicated and therefore expensive.

The object of the invention is to provide a fastening base for mounting an electrical device, such as an electric sensor or electric proximity switch, which virtually with a single manipulation allows replacement of the electrical device fixed therein without further aids or placing the electrical device in a clearly defined operating position.

This object is achieved by a fastening base for mounting an electrical device, particularly an electric sensor or an electric proximity switch, having a reception opening for receiving a connecting piece of the electrical device and with a locking pivoted lever for fixing the connecting piece in the reception opening, the locking pivoted lever being pivotable into a locking position and an open position, characterized in that the locking pivoted lever has a projecting wedge and that the wedge is constructed for an at least partial positive engagement with a recess in the connecting piece when the locking pivoted lever is pivoted into the locking position.

A fastening base of the aforementioned type is inventively further developed in that the locking pivoted lever has a projecting wedge and that the wedge is provided for an at least partial positive engagement with a recess in the connecting piece with the locking pivoted lever pivoted into the locking position.

The object is also achieved in a further aspect of the invention in that in the case of a fastening base of the aforementioned type the clamping part is a locking pivoted lever manually pivotable about a pivot pin or axis, provided with a wedge projecting from the surface of the lever and which on pivoting the lever into the locking position, e.g. clockwise or counterclockwise, engages substantially tangentially in the recess of the connecting piece of the electrical device and which on pivoting into the release position, e.g. counterclockwise or clockwise, is able to move out of the recess.

In a further inventive development of the fastening base, the pivot pin or axis is located in the vicinity of one end of the locking pivoted lever and with decreasing height the wedge is curved about the pivot pin or axis in such a way that on pivoting the lever into the locking position the wedge with its minimum height starts to engage in the recess of the connecting piece of the electrical device until at the end of the locking position the wedge is received with its full height in the recess.

One of the advantages of the fastening base according to the invention is that it makes it possible, with a single manipulation, to replace the electrical device, such as an electric sensor or proximity switch, mounted within the fastening base without requiring further aids. This allows a particularly simple fitting and handling of the inventive fastening base and also the electrical device.

In a further inventive development of the fastening base, the wedge comprises a straight wedge piece running along the longitudinal axis of the wedge and having a planar surface and a wedge piece curved around the pivot pin or axis and which pass into one another, both the straight wedge piece and the curved wedge piece running in a plane, the straight wedge piece running tangentially with respect to the pivot pin or axis and on pivoting the locking pivoted lever into the locking position the straight wedge piece is received within the recess of the connecting piece of the electrical device.

In a further inventive development of the fastening base, at one end the locking pivoted lever has a handle or grip and at the opposite end a roll or cylinder body, which has a through hole for receiving the pivot pin and running at right angles to the longitudinal axis of the locking pivoted lever, the wedge being positioned at least partly tangentially on the roll or cylinder body in the area thereof above the pivot pin.

According to a further inventive development of the fastening base, the straight wedge piece of the wedge is positioned at least partly tangentially on the roll or cylinder body in the area above the pivot pin and extends along the longitudinal axis of the locking pivoted lever, the curved wedge piece projecting radially from the surface of the roll or cylinder body and partially passing round the same.

In a further inventive development of the fastening base, the curved wedge piece is arranged in an inclined manner, so that in a vertical projection on the straight wedge piece, the start of the curved wedge piece is in direct connection to the straight wedge piece and the end of the curved wedge piece is mutually offset by a distance (s). In particular, the curved wedge piece can slope, in particular similar to a helix, round the roll or cylinder body. As a result and in advantageous manner on pivoting the locking pivoted lever said pivoting movement, which is a rotary movement, is transformed into a longitudinal movement of the electrical device, so that the latter is further drawn into the reception opening within the fastening base and is clamped there.

In a further inventive development of the fastening base, the latter has two side plates, which in each case have a facing bearing bore through which is passed the pivot pin of the locking pivoted lever, which is pivotally positioned about the pivot pin between the side plates and within the fastening base between the side plates, and in the area below the pivot pin, the fastening base has a recess for passing the wedge peripherally into the reception opening. The side plates of the fastening base can extend in the two outer surfaces thereof traversed by the reception opening.

In a further inventive development of the fastening base, the pivoting angle of the locking pivoted lever about its pivot pin or axis is approximately 180°.

In a further inventive development of the fastening base, the recess of the connecting piece of the electrical device, in which is engaged in the locking position the wedge of the locking pivoted lever, is a groove passing in a peripheral manner around the connecting piece. Both the groove passing peripherally around the connecting piece and the wedge can have a trapezoidal cross-section, the cross-section of the groove tapering downwards towards the bottom thereof and the cross-section of the wedge tapering upwards to its upper end. In this way, the longitudinal movement of the electrical device and the clamping action can be further reinforced.

The invention is described in greater detail hereinafter relative to the attached drawings, wherein show:

FIG. 1 A perspective view of a fastening base with a locking pivoted lever pivoted into the open position.

FIG. 2 A perspective view of the fastening base according to FIG. 1, the locking pivoted lever here being shown in an intermediate position preceding the closed position.

FIG. 3 A perspective view of the fastening base according to FIG. 1, the locking pivoted lever here being shown in the closed position.

Figure 4:
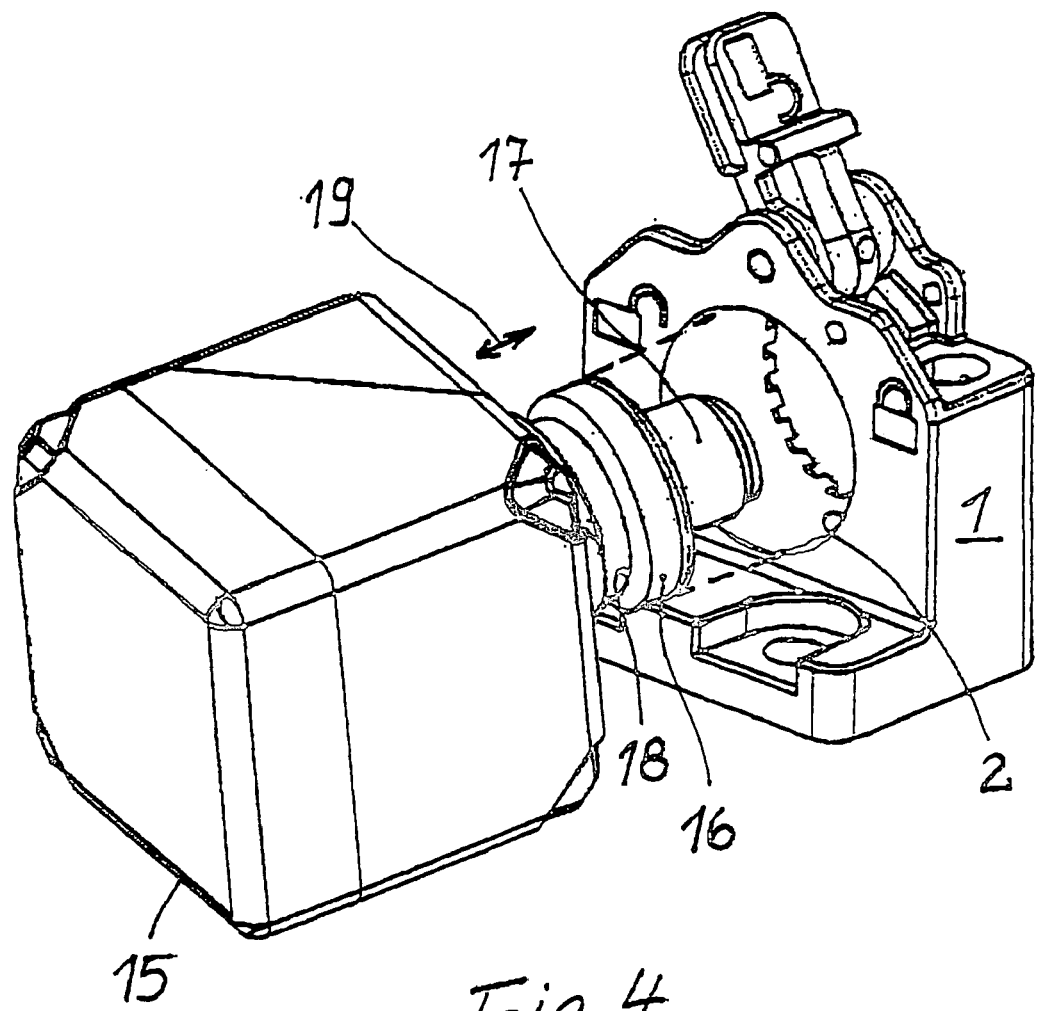

FIG. 4 A perspective exploded view of a sensor and the associated fastening base according to FIG. 1 for receiving and mounting the sensor.

Figure 5:
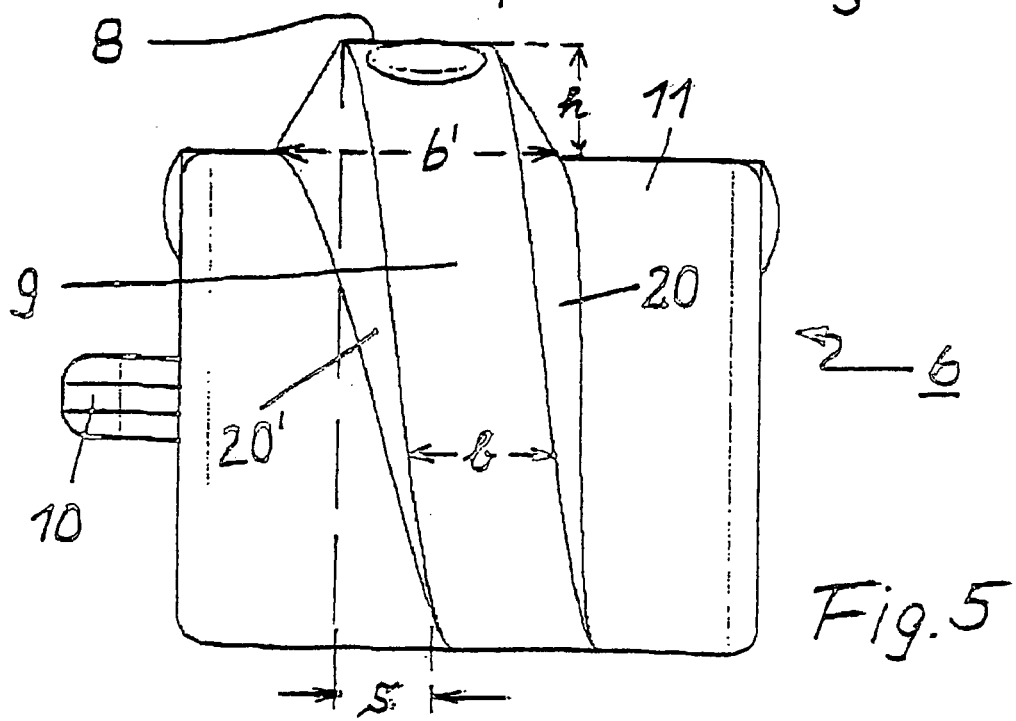

FIG. 5 A side view of the locking pivoted lever on the front, cylindrical end thereof for illustrating the curved height-decreasing wedge piece.

Figure 6:
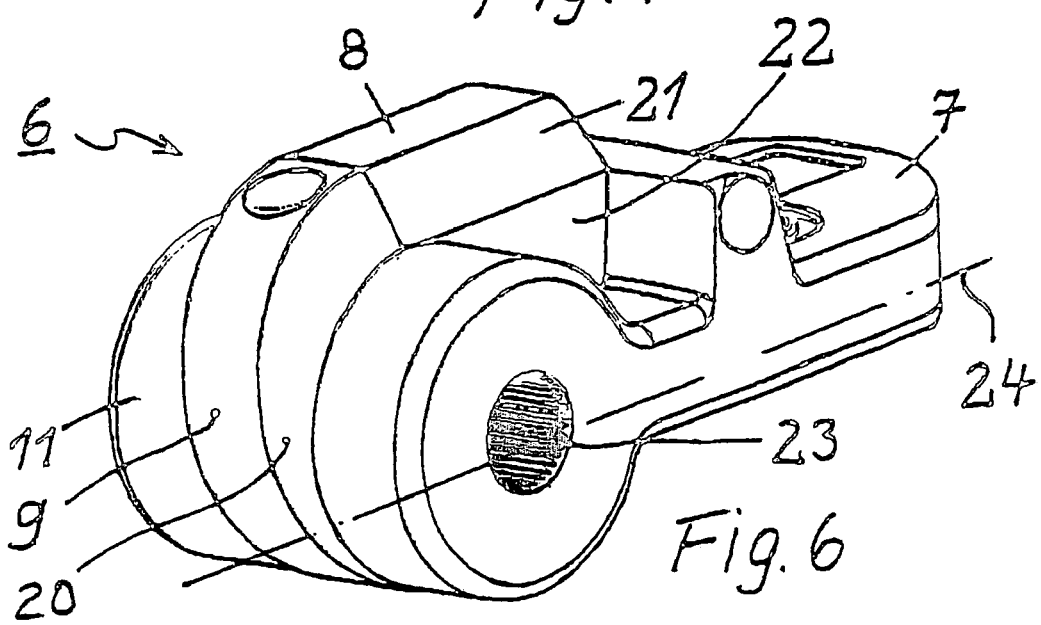

FIG. 6 A perspective view of the locking pivoted lever for illustrating the design thereof and the wedge in general.

According to FIGS. 1, 2 and 3 the fastening base 1 is essentially shaped like a parallelepiped or cuboid with two large, facing main surfaces, wherein on the fastening base 1 is shaped a base part 3 for increasing the standing surface. Within the base part 3 are provided through holes 4, 4' for receiving screws in order to be able to screw the fastening base to a substrate. The fastening base 1 has a reception opening 2, which is a through opening in the embodiment shown and serves to receive a casing 15 shown in FIG. 4 of a sensor, which can be in the form of a proximity switch, particularly an inductive proximity switch. The central axis 27 of the reception opening 2 is horizontally directed with respect to the fastening base 1 in the embodiment shown, but the reception opening can also be oriented vertically with respect to the fastening base.

At its upper end, the fastening base 1 has two facing side plates 5, 5', which extend in the extension of the covering surfaces of the fastening base 1 and within which there is in each case a bearing bore 12, which face one another in the two side plates 5, 5'. Between the side plates 5, 5' is provided a locking pivoted lever 6, which is pivotable by, e.g., 180° about a pivot pin 10 around one of its ends. As can be gathered from FIGS. 1 to 3, the locking pivoted lever 6 can be pivoted from an open position according to FIG. 1 into a closed position according to FIG. 3.

FIGS. 5 and 6 show the locking pivoted lever 6 in greater detail. The elongated locking pivoted lever 6 essentially comprises a grip or handle 7, which forms one freely movable end of the locking pivoted lever and a roll or cylinder body 11 integrally connected to the handle 7 and which has a through hole 23 for receiving the pivot pin 10. The roll body 11 consequently forms the rotation side end of the locking pivoted lever 6.

Along the longitudinal axis 24 of the locking pivoted lever, a wedge is placed on the roll body 11 and has a height, h, and projects somewhat over the roll body 11 towards the handle 7 and over the surface of the roll body 11 by the height h. Said wedge comprises a straight wedge piece 8 and a curved wedge piece 9. The straight wedge piece 8, which has the height h, as measured from the surface of the roll body 11, extends substantially in the direction of the longitudinal axis 24 above the through hole 23 over and beyond the roll body 11. Said straight wedge piece 8 is longitudinally bounded by two lateral, sloping side walls 21, which pass downwardly in the direction towards the through hole 23 into in each case one straight side wall 22. Thus, the cross-section of the straight wedge piece 8, which is connected tangentially to the roll body 11, is designed trapezoidally with respect to its sloping side walls 21 and the upper top surface, so that the straight wedge piece 8 is essentially shaped like a trapezohedron. To said straight wedge piece 8 is connected a curved wedge piece 9, which runs round the roll body 11 and has a decreasing height, so that the height of the curved wedge piece 9 decreases from the maximum height h when directly connected to the straight wedge piece 8 to zero revolving by 180° on the surface of the roll body 11. Thus, at least partly, the straight wedge piece 8 is placed tangentially on the roll or cylinder body 11 in the area above the pivot pin 10 thereon.

Moreover, in the embodiment shown, the curved wedge piece 9 slopes over the surface of the roll body 11, as can be gathered from FIG. 5. Thus, the lower end of the curved wedge piece 9 in a vertical projection is offset by the distance, s, with respect to the upper end of the curved wedge piece 9 having the height h. The curved wedge piece 9 consequently passes in a radially projecting manner from the surface of the roll or cylinder body 11 and partly around the same, the curved wedge piece 9 in particular passing like a helix round the roll or cylinder body 11.

For the passage of the wedge 8, 9 during the rotation of the locking pivoted lever 6 into the reception opening 2 of the fastening base 1 and consequently in the locking position, between the side plates 5, 5' and in the area below the pivot pin 10, the fastening base 1 has a recess 25, shown in broken line form in FIG. 1. Through said recess 25 the wedge can peripherally enter the reception opening firstly with its curved wedge piece 9 and then with its straight wedge piece 8 when there is further rotation of the locking pivoted lever 6. To improve the guidance of the wedge during its passage through the recess 25, laterally and on the inside of the side plates 5, 5' are provided guide plates 26.

The pivoting angle of the locking pivoted lever 6 about the pivot pin 10 is preferably approximately 180°.

FIG. 4 is a perspective exploded view of a casing 15 of a sensor and the associated fastening base 1 according to FIG. 1 for receiving and mounting the sensor casing 15. The casing 15 has a fixing flange 16, which has an external diameter in accordance with the internal diameter of the reception opening 2 of the fastening base 1 and which, in the direction of the central axis 27, is engaged with the fixing flange 16 in the reception opening 2. As the recess in which the wedge of the locking pivoted lever 6 engages in the locking position, the fixing flange 16 has a groove 18, which in the embodiment shown passes peripherally around the connecting piece 16. The groove 18 has a cross-section corresponding to the straight wedge piece 9 of the wedge, so that following the insertion of the fixing flange 16 into the reception opening 2, the wedge engages in fitting manner in groove 18.

In the presently shown example of the fastening base 1, both the groove 18 passing peripherally round the connecting piece 16 and the wedge 8, 9 have a trapezoidal cross-section, the cross-section of the groove 18 tapering downwards towards the bottom thereof and the cross-section of the wedge 8, 9 upwards to its upper end.

The fixing flange 16 is provided at its front end with a reception bush 17 within which is, e.g., provided as an electrical plug receptacle or an electrical plug insert for the electrical connection of a device.

For the mounting of the casing 15, the latter with its fixing flange 16 is inserted in the reception opening 2 of the fastening base 1. The locking pivoted lever 6 is then pivoted out of the open position shown in FIG. 1 into the closed position of FIGS. 2 and 3. In the course of this, the curved wedge piece 9 is firstly engaged in the groove 18 of the fixing flange 16. On further rotation, as a result of its helical contour, the wedge piece 9 draws the casing 15 firmly into the fastening base 1 until the straight wedge piece 8 is engaged in the groove. Thus, in the embodiment shown, the rotary movement of the locking pivoted lever 6 is transformed into a longitudinal movement of the casing 15.

In a simplified design, the wedge can also be completely located in one plane, so that there is no need for an additional longitudinal movement of the casing 15 on engaging the wedge in the groove of the fixing flange 16. In the same way the cross-section of the groove and that of the wedge can be square or rectangular.

| REFERENCE NUMERALS LIST | |
|---|---|
| 1 | Fastening base |
| 2 | Reception opening |
| 3 | Base part |
| 4, 4' | Through holes for screws |
| 5, 5' | Side plates |
| 6 | Locking pivoted lever |
| 7 | Grip or handle |
| 8 | Straight wedge piece |
| 9 | Curved wedge piece |
| 10 | Pivot pin |
| 11 | Roll body |
| 12 | Bearing bore |
| 13, 13' | Open position symbol |
| 14, 14' | Closed position symbol |
| 15 | Electrical component, such as a sensor |
| 16 | Connecting piece, such as fixing flange |
| 17 | Electric bush, such as electric socket |
| 18 | Groove |
| 19 | Double movement arrow |
| 20, 20' | Height-decreasing side walls of curved wedge piece |
| 21 | Sloping side wall of straight wedge piece |
| 22 | Straight side wall of straight wedge piece |
| 23 | Through hole |
| 24 | Longitudinal axis of locking pivoted lever |
| 25 | Recess |
| 26 | Guide plate |
| 27 | Central axis of reception opening |

The invention claimed is:

1. A fastening base for mounting an electrical device, the fastening base comprising:
    a reception opening for receiving a connecting piece of the electrical device, the connecting piece having a recess and the electrical device comprising at least one of: an electrical sensor or an electric proximity switch; and
    a locking pivoted lever for fixing said connecting piece in said reception opening, said locking pivoted lever being pivotable into a locking position and an open position;
    wherein said locking pivoted lever includes a projecting wedge that at least partially positively engages with said recess when said locking pivoted lever is pivoted into said locking position.

2. The fastening base according to claim 1, wherein said wedge projects from a surface of said locking pivoted lever.

3. The fastening base according to claim 1, wherein said wedge substantially tangentially engages in said recess upon pivoting said locking pivoted lever into said locking position.

4. The fastening base according to claim 1, wherein said wedge passes out of said recess upon pivoting said locking pivoted lever into a release position.

5. The fastening base according to claim 1, wherein said locking position of said locking pivoted lever is attainable by a clockwise rotation of said locking pivoted lever and said open position of said locking pivoted lever is attainable by a counterclockwise rotation of said locking pivoted lever.

6. The fastening base according to claim 1, wherein said locking position of said locking pivoted lever is attainable by a counterclockwise rotation of said locking pivoted lever and said open position of said locking pivoted lever is attainable by a clockwise rotation of said locking pivoted lever.

7. The fastening base according to claim 1, wherein said wedge has a trapezoidal cross-section tapering upwards towards an upper end of said wedge.

8. The fastening base according to claim 1, wherein said locking pivoted lever provides manual pivoting.

9. The fastening base according to claim 1, wherein said locking pivoted lever is a clamping part.

10. The fastening base according to claim 9, wherein, for mounting said electrical device within said reception opening, said clamping part can be lowered into said recess in said locking position, and, for releasing said electrical device, said clamping part can be raised from said recess into said open position.

11. The fastening base according to claim 1, further comprising a pivot pin for at least one of bearing and pivoting said locking pivoted lever.

12. The fastening base according to claim 11, wherein said pivot pin is located in the vicinity of one end of said locking pivoted lever.

13. The fastening base according to claim 11, wherein said wedge extends in a curved manner and with a decreasing height around said pivot pin.

14. The fastening base according to claim 11, wherein said wedge extends around said pivot pin such that, upon pivoting said locking pivoted lever into said locking position, said wedge starts to engage with its minimum height in said recess, and at the end of said locking position the full height of said wedge is received in said recess.

15. The fastening base according to claim 11, wherein a pivoting angle of said locking pivoted lever about said pivot pin is approximately one hundred eighty degrees.

16. The fastening base according to claim 11, wherein said wedge includes:
   a straight wedge piece extending along a longitudinal axis of at least one of said wedge and said locking pivoted lever; and
   a curved wedge piece that is curved around said pivot pin.

17. The fastening base according to claim 16, wherein said straight wedge piece and said curved wedge piece pass into one another.

18. The fastening base according to claim 16, wherein said straight wedge piece and said curved wedge piece both run in one plane.

19. The fastening base according to claim 16, wherein said straight wedge piece is tangentially located with respect to said pivot pin.

20. The fastening base according to claim 16, wherein said straight wedge piece is received within said recess when said locking pivoted lever is pivoted into said locking position.

21. The fastening base according to claim 16, wherein said straight wedge piece includes a planar surface.

22. The fastening base according to claim 16, wherein said curved wedge piece is positioned in a sloping manner, so that in a vertical projection on said straight wedge piece, a starting point of said curved wedge piece directly connects to said straight wedge piece, and an end point of said curved wedge piece is offset with respect to said staffing point by a distance.

23. The fastening base according to claim 16, further comprising at least one of a roll and a cylinder body at said locking pivoted lever; wherein said straight wedge piece extends at least partly tangentially with respect to said at least one of a roll and a cylinder body.

24. The fastening base according to claim 23, wherein said straight wedge piece is placed on said at least one of a roll and a cylinder body in an area above said pivot pin.

25. The fastening base according to claim 23, wherein said curved wedge piece projects radially from a surface of said at least one of a roll and a cylinder body and runs partly around said at least one of a roll and a cylinder body.

26. The fastening base according to claim 16, wherein said locking pivoted lever includes at least one of a roll and a cylinder body, and wherein said curved wedge piece slopes around said at least one of a roll and a cylinder body.

27. The fastening base according to claim 26, wherein said curved wedge piece slopes around said at least one of a roll and a cylinder body in a helical manner.

28. The fastening base according to claim 11, further comprising two side plates, wherein each of the two side plates has a facing bearing bore through which said pivot pin is guided.

29. The fastening base according to claim 28, wherein said locking pivoted lever is arranged for pivoting about said pivot pin between said two side plates.

30. The fastening base according to claim 28, wherein said two side plates extend in two outer surfaces of said fastening base that are traversed by said reception opening.

31. The fastening base according to claim 28, further comprising a further recess for the passage of said wedge in a peripheral manner into said reception opening.

32. The fastening base according to claim 31, wherein said further recess is located in an area below said pivot pin and between said two side plates.

33. The fastening base according to claim 1, wherein said locking pivoted lever includes:
   a handle at one end; and
   at least one of a roll and a cylinder body at an opposite end.

34. The fastening base according to claim 33, wherein said wedge extends in an at least partially tangential manner with respect to said at least one of a roll and a cylinder body.

35. The fastening base according to claim 33, wherein said locking pivoted lever further includes a pivot pin for at least one of bearing and pivoting said locking pivoted lever, and wherein said at least one of a roll and a cylinder body includes a through hole for receiving the pivot pin.

36. The fastening base according to claim 35, wherein said through hole runs at a right angle to a longitudinal axis of said locking pivoted lever.

37. The fastening base according to claim 35, wherein said wedge is placed on said at least one of a roll and a cylinder body in an area located above said pivot pin.

38. A fastening system, comprising:
   an electrical device that includes a connecting piece having a recess, the electrical device comprising at least one of: an electrical sensor or an electric proximity switch; and a fastening base for mounting said electrical device, the fastening base including:
    a reception opening for receiving said connecting piece; and
    a locking pivoted lever for fixing said connecting piece in said reception opening,
said locking pivoted lever being pivotable into a locking position and an open position;
wherein said locking pivoted lever includes a projecting wedge that at least partially positively engages with said recess when said locking pivoted lever is pivoted into said locking position.

39. The fastening system according to claim 38, wherein said connecting piece projects from said electrical device.

40. The fastening system according to claim 38, wherein said connecting piece fits into said reception opening.

41. The fastening system according to claim 38, wherein said recess is arranged peripherally and at least partly circumferentially on said connecting piece.

42. The fastening system according to claim 38, wherein said wedge substantially tangentially engages in said recess on pivoting said locking pivoted lever into said locking position.

43. The fastening system according to claim 38, wherein said connecting piece comprises a fixing flange for holding the electrical device in a defined operating position.

44. The fastening system according to claim 38, wherein said recess is a groove.

45. The fastening system according to claim 44, wherein said groove has a trapezoidal cross-section tapering downwards towards the bottom of said groove.

46. The fastening system according to claim 44, wherein said groove passes in a peripheral manner around said connecting piece.

47. The fastening system according to claim 38, wherein said fastening base further includes a pivot pin for at least one of bearing and pivoting said locking pivoted lever.

48. The fastening system according to claim 47, wherein said wedge extends in a curved manner and with a decreasing height around said pivot pin.

49. The fastening system according to claim 47, wherein said wedge extends around said pivot pin such that, on pivoting said locking pivoted lever into said locking position, said wedge starts to engage with its minimum height in said recess, and at the end of said locking position the full height of said wedge is received in said recess.

50. The fastening system according to claim 47, wherein said wedge includes:
    a straight wedge piece extending along a longitudinal axis of at least one of said wedge and said locking pivoted lever; and
    a curved wedge piece which is curved around said pivot pin.

51. The fastening system according to claim 50, wherein said straight wedge piece and said curved wedge piece pass into one another.

52. The fastening system according to claim 50, wherein said straight wedge piece and said curved wedge piece both run in one plane.

53. The fastening system according to claim 50, wherein said straight wedge piece is tangentially located with respect to said pivot pin.

54. The fastening system according to claim 50, wherein said straight wedge piece is received within said recess when said locking pivoted lever is pivoted into said locking position.

55. The fastening system according to claim 50, wherein said curved wedge piece is positioned in a sloping manner, so that in a vertical projection on said straight wedge piece a staffing point of said curved wedge piece directly connects to said straight wedge piece and an end point of said curved wedge piece is offset with respect to said staffing point by a distance.

56. The fastening system according to claim 50, wherein said locking pivoted lever further includes at least one of a roll and a cylinder body, and wherein said curved wedge piece extends around said at least one of a roll and a cylinder body.

57. The fastening system according to claim 56, wherein said curved wedge piece slopes around said at least one of a roll and a cylinder body in a helical manner.

58. The fastening system according to claim 38, wherein said locking pivoted lever further includes:
    a handle at one end; and
    at least one of a roll and a cylinder body at an opposite end.

59. The fastening system according to claim 58, wherein said fastening base further includes a pivot pin for at least one of bearing and pivoting said locking pivoted lever, and wherein said at least one of a roll and a cylinder body includes a through hole for receiving the pivot pin.

60. The fastening system according to claim 59, wherein said fastening base further includes two side plates, wherein each of the two side plates have a facing bearing bore through which said pivot pin is guided.

61. A fastening base for mounting an electrical device having a connecting piece with a recess, the fastening base comprising:
    a reception opening for receiving said connecting piece;
    a locking pivoted lever for fixing said connecting piece in said reception opening, said locking pivoted lever being pivotable into a locking position and an open position; and
    a pivot pin for at least one of bearing and pivoting said locking pivoted lever;
    wherein said locking pivoted lever includes a projecting wedge that at least partially positively engages with said recess when said locking pivoted lever is pivoted into said locking position, and wherein said wedge extends in a curved manner and with a decreasing height around said pivot pin.

62. A fastening base for mounting an electrical device having a connecting piece with a recess, the fastening base comprising:
    a reception opening for receiving said connecting piece;
    a locking pivoted lever for fixing said connecting piece in said reception opening, said locking pivoted lever being pivotable into a locking position and an open position; and
    a pivot pin for at least one of bearing and pivoting said locking pivoted lever;
    wherein said locking pivoted lever includes a projecting wedge that at least partially positively engages with said recess when said locking pivoted lever is pivoted into said locking position, and wherein said wedge includes:
    a straight wedge piece extending along a longitudinal axis of at least one of said wedge and said locking pivoted lever; and
    a curved wedge piece that is curved around said pivot pin.

63. A fastening system, comprising:
an electrical device that includes a connecting piece having a recess; and
a fastening base for mounting said electrical device, the fastening base including:
   a reception opening for receiving said connecting piece;
   a locking pivoted lever for fixing said connecting piece in said reception opening, said locking pivoted lever being pivotable into a locking position and an open position; and
   a pivot pin for at least one of bearing and pivoting said locking pivoted lever;
wherein said locking pivoted lever includes a projecting wedge that at least partially positively engages with said recess when said locking pivoted lever is pivoted into said locking position, and wherein said wedge extends in a curved manner and with a decreasing height around said pivot pin.

64. A fastening system, comprising:
an electrical device that includes a connecting piece having a recess; and
a fastening base for mounting said electrical device, the fastening base including:
   a reception opening for receiving said connecting piece;
   a locking pivoted lever for fixing said connecting piece in said reception opening, said locking pivoted lever being pivotable into a locking position and an open position; and
   a pivot pin for at least one of bearing and pivoting said locking pivoted lever;
wherein said locking pivoted lever includes a projecting wedge that at least partially positively engages with said recess when said locking pivoted lever is pivoted into said locking position, and wherein said wedge extends around said pivot pin such that, on pivoting said locking pivoted lever into said locking position, said wedge starts to engage with its minimum height in said recess, and at the end of said locking position the full height of said wedge is received in said recess.

\* \* \* \* \*

UNITED STATES PATENT AND TRADEMARK OFFICE
CERTIFICATE OF CORRECTION

| | | |
|---|---|---|
| PATENT NO. | : 7,210,961 B2 | Page 1 of 1 |
| APPLICATION NO. | : 10/515702 | |
| DATED | : May 1, 2007 | |
| INVENTOR(S) | : Berg | |

It is certified that error appears in the above-identified patent and that said Letters Patent is hereby corrected as shown below:

Column 10, claim 55:
    In line 4, please remove the word "staffing" and insert the word --starting--; and in line 6, please remove the word "staffing" and insert the word --starting--.

Signed and Sealed this

Twenty-eighth Day of August, 2007

JON W. DUDAS
*Director of the United States Patent and Trademark Office*